United States Patent [19]

Birchak et al.

[11] Patent Number: 5,087,900

[45] Date of Patent: Feb. 11, 1992

[54] TRANSMISSION LINE NETWORK FOR MULTIPLE CAPACITIVE LOADS

[75] Inventors: James R. Birchak, Spring; Wai-Leung Hon, Sugarland; Michael Ruhovets, Houston, all of Tex.

[73] Assignee: Reliability Incorporated, Houston, Tex.

[21] Appl. No.: 615,477

[22] Filed: Nov. 19, 1990

[51] Int. Cl.$^5$ .............................................. H03H 7/48
[52] U.S. Cl. .................................. 333/100; 307/263; 324/158 R; 333/20; 333/127
[58] Field of Search .................. 333/20, 100, 127, 128, 333/136; 307/263, 443; 328/65; 324/158 R, 158 F

[56] References Cited

U.S. PATENT DOCUMENTS

| | | |
|---|---|---|
| 3,267,394 | 8/1966 | Peil et al. .............................. 333/136 |
| 4,210,885 | 7/1980 | Ho . |
| 4,374,317 | 2/1983 | Bradshaw . |
| 4,408,282 | 10/1983 | Hof . |
| 4,595,923 | 6/1986 | McFarland, Jr. . |
| 4,908,576 | 3/1990 | Jackson ....................... 324/158 R X |
| 4,928,062 | 5/1990 | Miles et al. . |
| 4,947,144 | 8/1990 | Le Nohaic ............................ 333/128 |

FOREIGN PATENT DOCUMENTS

85780  3/1990  Japan .................................. 307/263

*Primary Examiner*—Paul Gensler
*Attorney, Agent, or Firm*—David S. Wise

[57] ABSTRACT

An improved transmission line network includes a transmission line connecting a signal source to a plurality of capacitive loads. Preferably, the transmission line is not terminated with its characteristic impedance. The transmission line may include capacitance added for the purpose of smoothing the rising or falling edge of signals distorted by reflections from the far end of the network. In addition, the transmission line network preferably includes resistance added in series with the transmission line for the purpose of dissipating reflections from the far end and thereby reducing distortion upstream from the series resistors. The capacitive loads may be connected to the transmission line through series resistors, the magnitudes of which are selected to obtain uniform rise or fall times at all loads.

13 Claims, 4 Drawing Sheets

TRANSMISSION LINE NETWORK FOR MULTIPLE CAPACITIVE LOADS

CROSS-REFERENCE TO RELATED APPLICATION

The assignee of the present application is also the assignee of a related copending application, Ser. No. 07/464404 for a "Driver System and Distributed Transmission Line Network for Driving Devices Under Test," filed on Jan. 12, 1990.

BACKGROUND OF THE INVENTION

The present invention relates generally to apparatus for use in digital electronic circuits, and, more particularly, to a transmission line network for driving circuit components. Still more particularly, the present invention is directed to an improved transmission line network for delivering low distortion digital signals with relatively uniform rise times to multiple, distributed capacitive loads.

According to present practices, integrated circuit ("IC") packages are mass-produced and installed in electronic circuits within highly sophisticated, complex, and costly equipment. As with many mass-produced products, IC packages occasionally are prone to failure, in many cases at the beginning of operation. The complexity of the equipment within which such packages are installed makes post-installation failures highly undesirable. For example, when equipment reaches the final inspection stage of production, before failures are detected, the high level skills required for testing and repair add a significant cost to production expenses. Even more significantly, when the product has been installed in the field and a service technician must make repairs, the costs thereby incurred can have a significant effect on profitability. As a result, manufacturers of electronic equipment are demanding ever greater quality and dependability in commercial grade IC packages.

Quality and dependability are enhanced substantially by early detection of those IC packages likely to fail in the first few hours of operation. Virtually all IC packages manufactured today, before they are sold for use in electronic equipment, are "burned-in" for a predetermined period of time and then tested to detect IC packages that are defective or otherwise liable to fail prematurely.

The burn-in process includes (i) placing the IC packages in sockets arranged in arrays on printed circuit boards ("burn-in boards"); (ii) placing the burn-in boards with the packages, or devices under test ("DUTs"), mounted thereon in a chamber whose environment, particularly temperature, is controllable; (iii) applying direct current ("dc") biases to each package on each board in such a manner as to forward and reverse bias as many of the package's junctions as possible, and/or actively clocking each package up to its maximum rated conditions, such application of dc biases and clock signals being accomplished substantially simultaneously to each DUT on a burn-in board; (iv) removing the burn-in boards from the chamber after the IC packages have been subjected to the environmental condition of the chamber and the biases and clock signals for a designated period of time; and (v) removing the IC packages from the burn-in boards. The present invention focuses primarily on step (iii), which may also include the simultaneous application of test signals to the DUTs, with monitoring of the results of such testing.

A conventional burn-in board includes a plurality of sockets arranged in rows and columns. Signal lines, or traces etched onto the printed circuit card comprising the burn-in board, connect each pin of each socket to a tab on the connector edge of the board. Typically, one tab on an edge connector connects to one particular pin on each socket. The signal line between the tab and a socket pin may be modeled as a portion of a transmission line.

Each such transmission line typically "fans out" in several branches to a plurality of DUTs. One transmission line, for example, may be subdivided into a major bus line with a plurality of parallel subsidiary transmission lines branching off of the major bus line. The major bus line may extend along one end of the burn-in board, and the subsidiary transmission lines, in such case, may correspond to each row of sockets on the burn-in board, with the sockets of each row distributed serially along a subsidiary transmission line. In order to inimize the amount of power required to be delivered by the driver, the transmission lines connecting the driver to each socket typically are not terminated with the characteristic impedance of the transmission line.

A conventional burn-in system or burn-in and test system includes an environmental chamber having means for receiving a plurality of burn-in boards. The connector edge on each burn-in board is received within an edge connector, preferably outside the burn-in chamber. The opposing side of the edge connector may be attached to a second printed circuit card, or driver board, or it may be attached to a printed circuit backplane assembly, which also has edge connectors for receiving driver boards, as shown and described in U.S. Pat. No. 4,374,317.

The driver boards generate digital signals for exercising and testing the DUTs on the burn-in boards within the burn-in chamber. The digital signals are propagated through the edge connector and along parallel transmission lines on the burn-in board to the target pin on each DUT. Because the transmission lines typically are not terminated with the characteristic impedance of the transmission lines, signal reflection from the far end of the signal line, as well as from distributed loads, tends to cause distortion of signals propagated along the transmission lines. This distortion includes overshoot near the far end of the lines and a pause or "step" in the rising or falling edge of the signal near the starting end of the lines, more precisely a period in the rising or falling edge during which the slope of the signal approaches zero or actually reverses before resuming its rise or fall to the intended level.

Signal distortion may also be caused by cross-talk between the plurality of transmission lines. Each DUT on a burn-in board typically includes a plurality of pins, each of which may connect to a different transmission line. Because space is limited on a burn-in board, the plurality of parallel transmission lines are positioned in close proximity to one another. As a consequence, capacitive and/or inductive coupling between adjacent transmission lines may cause waveshape distortion of signals propagating along the transmission lines.

Similar problems exist in transmission line networks other than the network connecting drivers to sockets on a burn-in board. Outside the burn-in chamber, for example, a network of parallel transmission lines may connect a pattern generator to a plurality of driver boards.

The transmission line network may comprise a ribbon cable or a printed circuit board, and the driver boards may be distributed serially along the transmission lines. Because of the close proximity of the parallel transmission lines and the absence of a circuit terminating the transmission lines with their characteristic impedance, signals propagated along the network experience waveshape distortion similar to that discussed in connection with the burn-in board transmission lines.

Waveshape distortion such as that discussed herein can cause a number of problems that tend sometimes to invalidate the results of the testing and exercising to which the DUTS are exposed in the burn-in chamber. These problems include, for the step distortion described above, double triggering of the DUT by the nonuniform slope of the rising or falling edge of the signal and, for overshoot, latch-up of the DUT during which the DUT might be destroyed.

Thus, it would be desirable to provide a transmission line network for delivering a plurality of signals to a plurality of capacitive loads in which the transmission lines are not terminated with their characteristic impedance and the signals propagated along the transmission lines have relatively uniform rise or fall times and waveshapes not distorted by excessive overshoot or crosstalk.

SUMMARY OF THE INVENTION

Accordingly, there is provided herein an improved transmission line network for propagating distortion-free signals with relatively uniform rise times in spite of a termination not substantially equivalent to the characteristic impedance of the transmission line. The improved transmission line preferably includes a plurality of resistors in series with the transmission line for dissipating reflected signals. If the transmission line includes load resistors isolating the capacitive loads from the transmission line, the magnitude of the load resistors preferably is varied to achieve a uniform rise time at each load. In addition, the transmission line network may include capacitance added for the purpose of boosting the rising edge of signals at the near end of the network so as to smooth rising edges distorted by reflected signals.

These and various other characteristics and advantages of the present invention will become apparent to those skilled in the art upon reading the following detailed description.

BRIEF DESCRIPTION OF THE DRAWINGS

For a detailed description of the preferred embodiment of the invention, reference will be made now to the accompanying drawings, wherein.

FIG. illustrates schematically a single prior art transmission line network connecting devices under test on a burn-in board to a driver on a driver board.

DETAILED DESCRIPTION OF THE PREFERRED EMBODIMENT

"Burn-in" refers generally to any one of several techniques whereby integrated circuit ("IC") packages are stressed within their physical and electrical limits prior to their sale or distribution so that those packages likely to become early failures in completed equipment can be discovered. The burn-in techniques include (1) loading the IC packages into sockets on burn-in boards; (2) placing the burn-in boards in a chamber whose environment, particularly temperature, is controllable; (3) applying electrical signals to the boards while subjecting the IC packages to the maximum temperature rating therefor (in some cases), monitoring the signals (in some cases), functionally testing the IC packages (in some cases); (4) removing the burn-in boards from the chamber; and (5) unloading the IC packages from the burn-in boards. The present invention focuses on the third step and presents an improved driver system and distributed transmission line network for delivering signals to the devices under test ("DUTs").

A typical IC package or DUT, as is referred to herein, comprises a dual in-line package ("DIP") having a body portion which is generally a parallelpiped with from four to sixty-four electrical leads or terminals with a generally L-shaped cross-section extending out and down from the opposing sides of the body. The overall width of the DIP may be, for example, 0.3, 0.4 or 0.6 inch. Sockets mounted on the burn-in board include socket contacts defining slots for receiving electrical leads on DIPs.

Unless specified otherwise herein, the terms "IC package" and "DUT" may also refer to a surface mounted device (a "chip carrier") including small outline integrated circuits (SOICs), plastic leaded chip carriers (PLCCs), ceramic leaded chip carriers (CLCCs), leadless chip carriers (LCCs), pin grid arrays (PGAs) or any other circuit made by processing semiconductor material.

Figure 1:
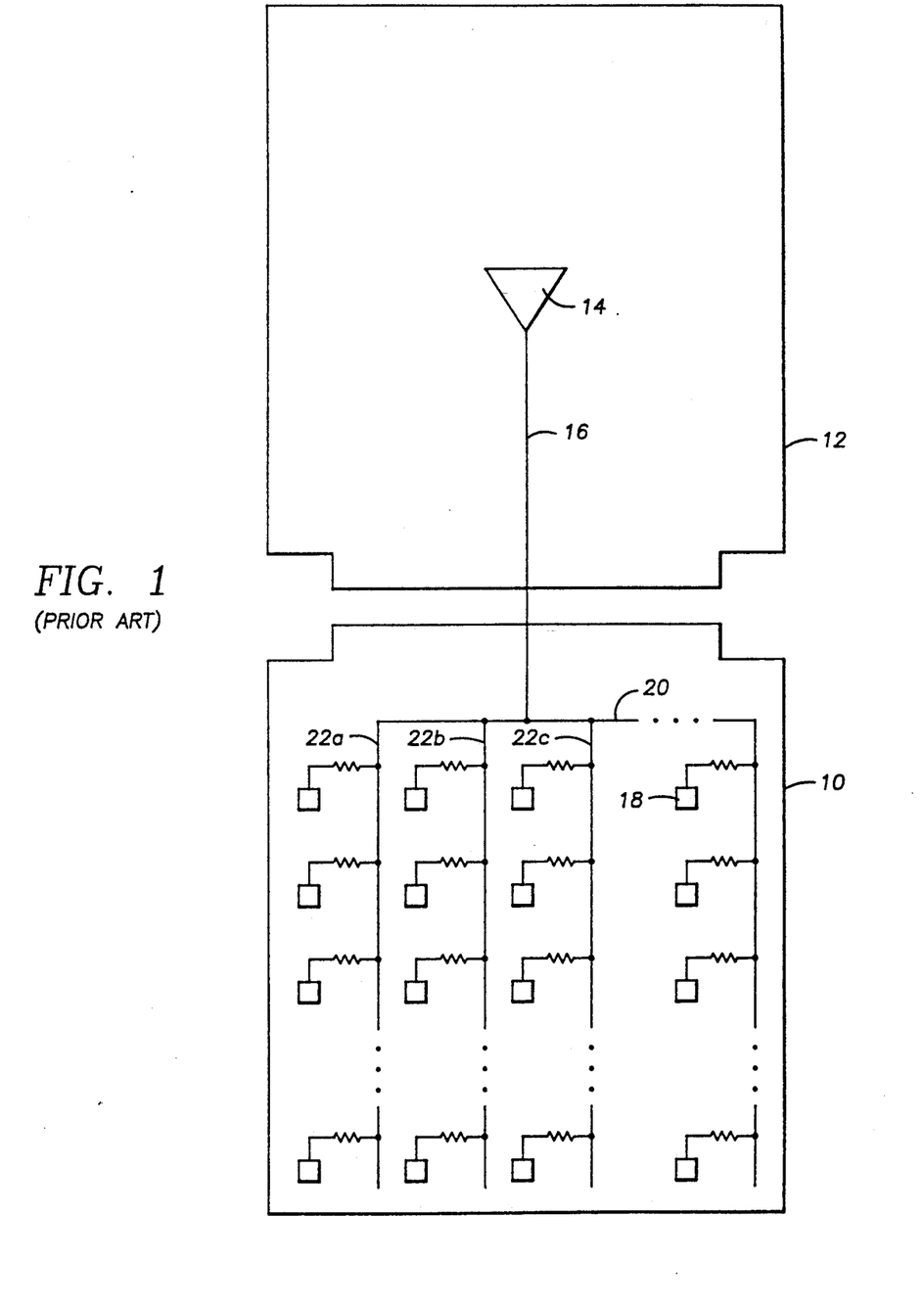

A conventional burn-in system includes a plurality of burn-in boards mounted within a burn-in chamber and connected electrically through edge connectors to driver boards positioned outside the chamber. FIG. 1 depicts schematically a prior art burn-in board 10 and driver board 12 connected electrically by means of an edge connector (not shown).

A driver 14 on the driver board 12 generates digital signals that are propagated along a transmission line network 16 to a plurality of sockets 18 on the burn-in board 10. In actual application, the driver board 12 may include a plurality of drivers connected by means of a plurality of transmission line networks to different pins on the same sockets 18. For ease of understanding, however, FIG. 1 depicts only one such network 16. Also in actual application, the sockets 18 receive DUTs for burn-in within the burn-in system.

In a conventional burn-in system, the transmission line network 16 shown in FIG. 1 typically fans out in several branches from a single tab on the edge connector of the burn-in board 10 to each of the sockets 18. Thus, the network 16 may include a primary bus 20 extending along one end of each column of sockets on the burn-in board 10 and a plurality of branches or secondary buses 22a,b,c corresponding to each column of sockets 18.

Figure 2:
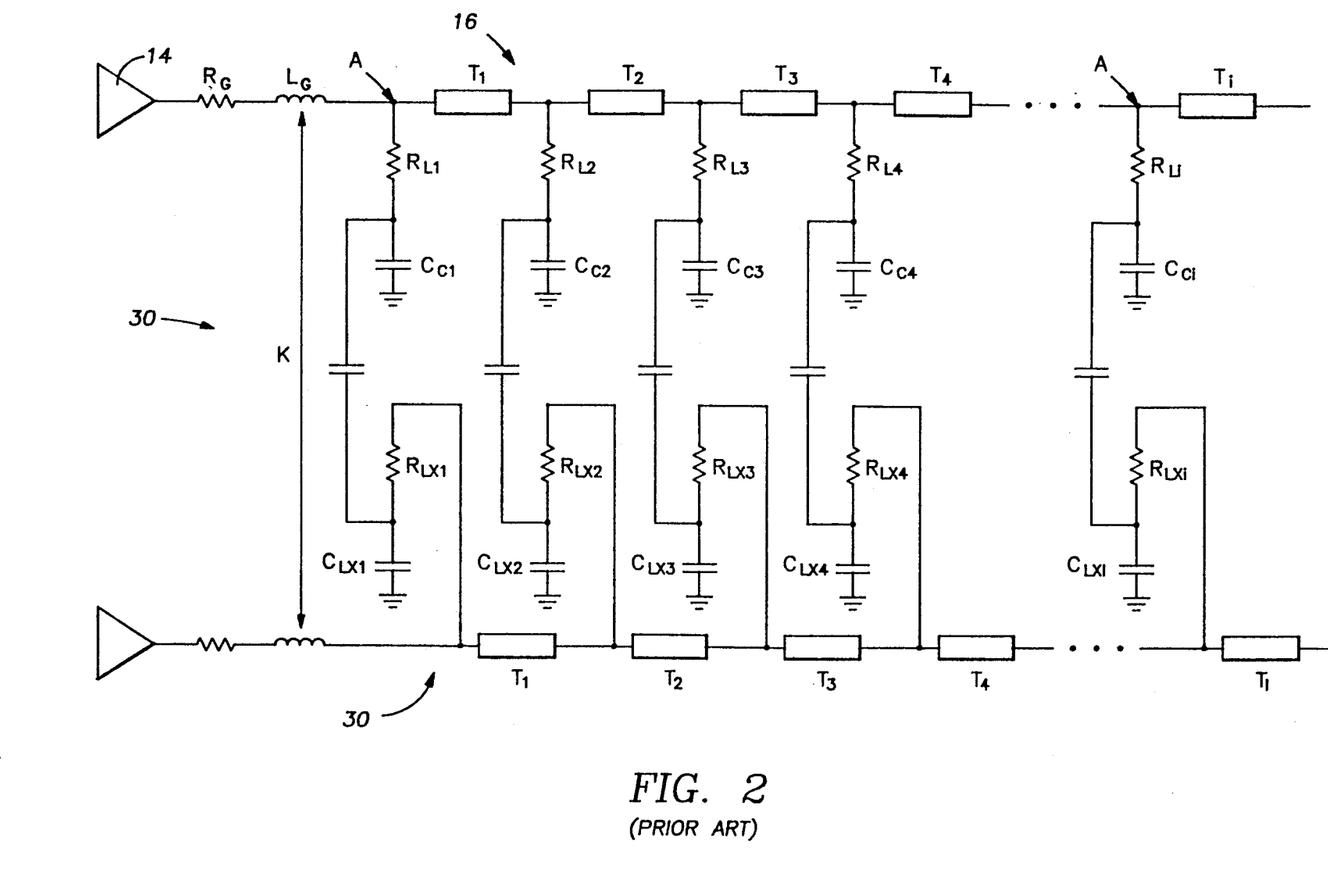
FIG. 2 is a partial schematic diagram of the transmission line network depicted in FIG. 1, along with a second transmission line network.

FIG. 2 shows a schematic diagram of a portion of the transmission line network 16 depicted in FIG. 1 and a portion of an adjacent network not shown in FIG. 1. FIG. 2 depicts the driver 14, with its internal resistance $R_G$ and inductance $L_G$, which may include the inductance of the traces or wire comprising the transmission line network 16 on the driver board 12 and the inductance of the edge connector. The transmission line itself is represented schematically in several sections $T_1$, $T_2$, $T_3$, $T_4$, and $T_i$. Transmission line $T_1$ is a section of transmission line corresponding to the DUT or DUTs represented by the first load capacitor $C_{L1}$, as explained below. The same is true for each succeeding section of transmission line $T_i$.

Each DUT or group of DUTs is represented schematically in FIG. 2 as a load capacitor $C_{L1}$, $C_{L2}$, $C_{L3}$, $C_{L4}$, and $C_{Li}$. Each DUT or load capacitor $C_{Li}$ is connected between ground and the transmission line $T_i$, through a socket isolation resistor $R_{L1}$, $R_{L2}$, $R_{L3}$, $R_{L4}$, and $R_{Li}$. Conventionally, each socket isolation resistor $R_{Li}$ is identical. As will be evident on comparison of FIGS. 1 and 2, the schematic diagram in FIG. 2 depicts only a portion of the transmission line 16 shown in FIG. 1.

The portion of the transmission line 16 shown in FIG. 2 may represent a portion of the primary bus 20, with each load capacitor $C_{Li}$ representing the effective capacitive load of an entire row of DUTs, or may represent a single secondary bus 22, with each load capacitor representing a single DUT or the effective capacitive load of several sequential DUTs connected to the secondary bus. In situations in which each load capacitor $C_{Li}$ represents the effective load capacitance of an entire row of DUTs, the isolation resistors $R_{Li}$ may represent the effective resistance of a plurality of socket isolation resistors, or they may represent the resistance of a single row isolation resistor in a system with row isolation rather than socket isolation.

In yet another alternative, each load depicted in the schematic diagram in FIG. 2 may represent the effective load of a single load or group of sequential loads on each of several secondary buses 22a,b,c arranged in parallel relative to one another. Thus, the entire array of DUTs depicted in FIG. 1 could be modelled as the schematic diagram depicted in FIG. 2.

Also depicted in FIG. 2 is a parallel transmission line network 30 constructed identical to the network 16 shown in FIG. 1. The second transmission line network 30 is included in FIG. 2 in order to demonstrate the propensity for inductive and capacitive coupling on parallel transmission line networks. Thus, the inductors $L_G, L_{Gx}$ at the near end of the transmission lines networks 16,30 may induce distortion in the form of crosstalk in accordance with a coupling coefficient K. Inductive coupling is primarily a problem at the near end of the transmission line network around the edge connector.

Capacitive coupling, which causes cross-talk distortion, is represented schematically in FIG. 2 by means of the several coupling capacitors $C_{C1}$, $C_{C2}$, $C_{C3}$, $C_{C4}$, and $C_{Ci}$. Capacitive coupling is primarily a problem near the sockets 18 (or the load capacitors $C_{Li}$, as shown on FIG. 2) on the burn-in board 10.

Figure 3:
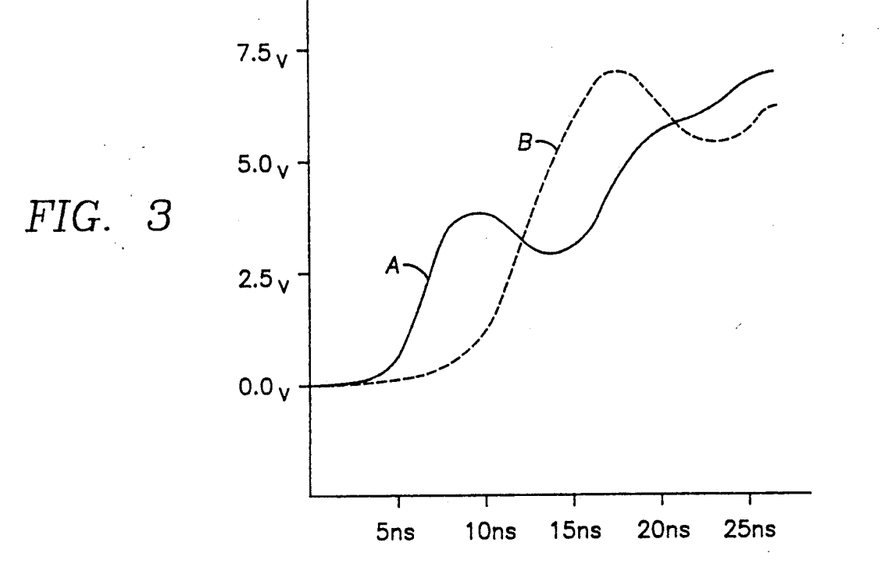
FIG. 3 is a graph depicting voltage waveforms at two points on the transmission line network shown in FIG. 2.

FIG. 3 demonstrates the problem to which the present invention in addressed. The graph depicted in FIG. 3 shows typical rising edges of a signal (at TTL logic levels) propagated along the transmission line network 16 as measured at the near end (point A) and the far end (point B) of the transmission line network 16. As shown, the signal at the near end includes a step in the rising edge due to the finite driver internal resistance and signal reflections.

This step results in an unacceptably long rise time, which typically is the time required for the rising edge of the signal to make the transition from 10% to 90% of its high level. Preferably, the rise time for a signal propagated along the transmission line network is as short as possible, but no greater than 10 ns for TTL-compatible, advanced CMOS logic. As shown in FIG. 3, the rise time for the signal at point A is approximately 15 ns. In addition, the step distortion in the signal at point A may also result in a double transition through the trigger point on the DUT, causing it to turn on, then off, then on again, which may adversely affect the integrity of the test or exercise being performed.

Referring still to FIG. 3, the signal measured at point B has an overshoot of approximately 50% as a result of the reflected signal combining with the original signal to boost its magnitude beyond the normal high level for the original signal. Preferably, overshoot should not exceed 10% of the high level for the type of devices in use. Excessive overshoot can cause a condition referred to as latch-up, in which the DUT fails to operate according to its intended purpose, thereby falsely indicating a test failure or failing to be exercised as intended.

Figure 4:
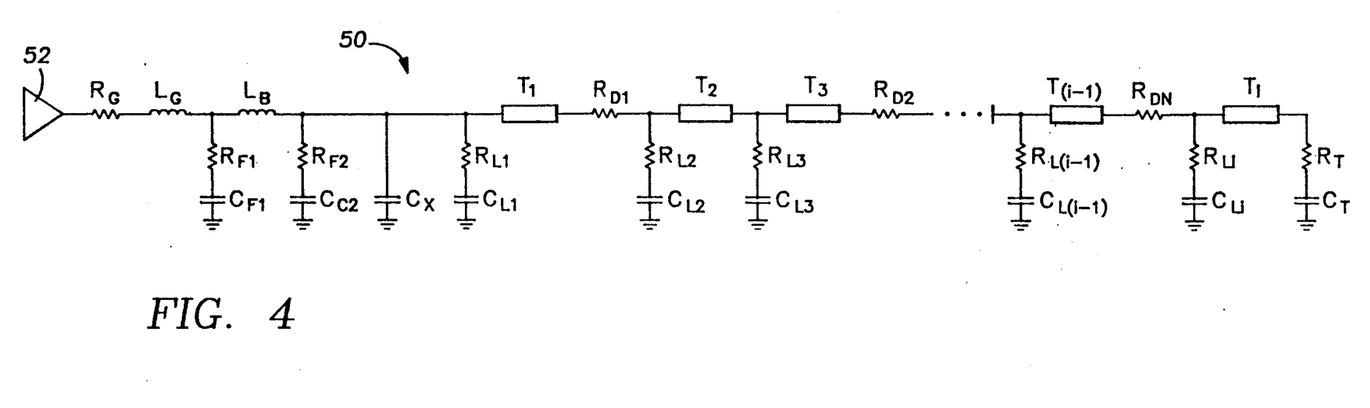
FIG. 4 is a schematic diagram showing the transmission line of FIG. 2 improved in accordance with the principles of the invention.

FIG. 4 depicts the transmission line network 16 of FIG. 2 reconfigured in accordance with the principles of the present invention to give fast rise times with minimal signal distortion due to overshoot and crosstalk. Referring now to FIG. 4, the improved transmission line network comprises a transmission line network 50 for delivering digital signals from a driver 52 to a plurality of capacitive loads $C_{Li}$, with added capacitance $C_x$, variable series resistors $R_{Di}$, and variable load resistors $R_{Li}$ selected and positioned in accordance with the method set forth herein. The improved transmission line network 50 may also include a near end impedance matching network $R_{Fi}, C_{Fi}$.

The improved transmission line network 50 as described herein is a transmission line network connecting a driver to a plurality of DUTs on a burn-in board. It will be apparent to those skilled in the art on studying the disclosure set forth herein that the improved network 50 can be used to advantage in other applications as well. Another example of a suitable application for the transmission line network 50 within the burn-in art is the distribution of signals from a pattern generator to a plurality of driver boards.

Figure 5:
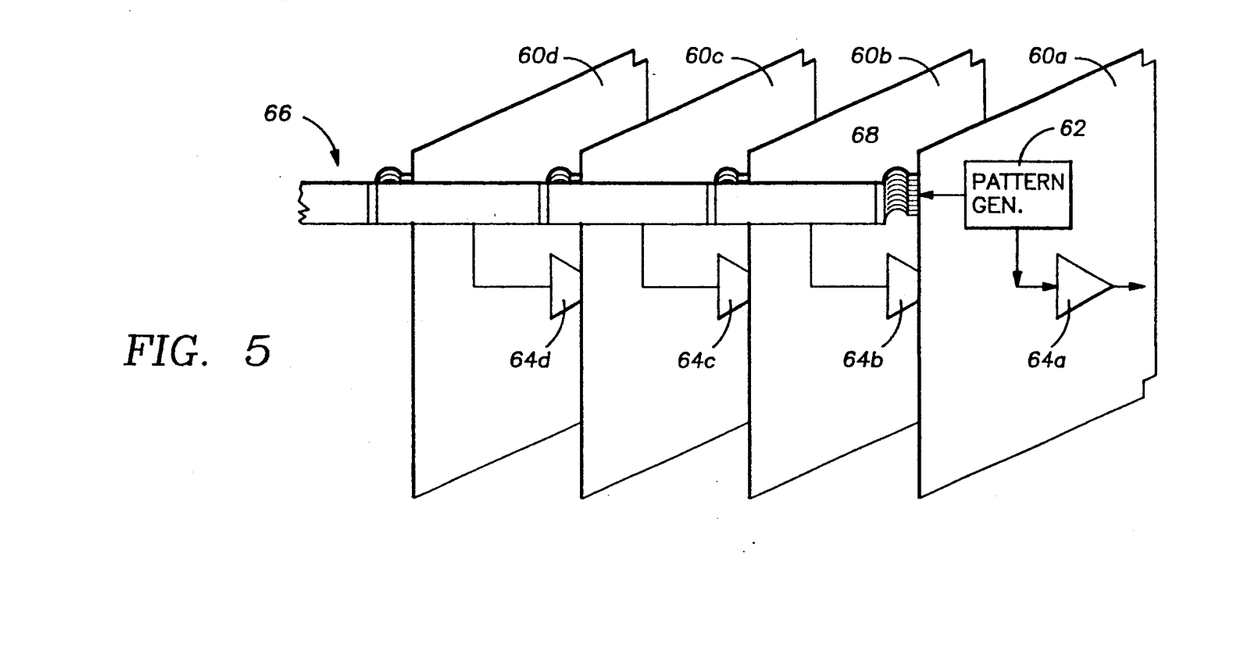
FIG. 5 shows a schematic representation of a transmission line network connecting a pattern generator on a first driver board to a plurality of succeeding driver boards.

FIG. 5 depicts four of a series of driver boards 60a,b,c,d in perspective, as they might be received with a backplane assembly of a burn-in chamber. The master driver board 60a includes a pattern generator 62, which creates a plurality of signal patterns, each pattern to be delivered by a driver 64a,b,c,d to one particular pin on the DUTs within the burn-in chamber. The signal patterns generated on the master driver board 60a are communicated to the drivers 64b,c,d on the other driver boards 60b,c,d by means of a plurality of transmission line networks 66. The transmission line networks 66 may comprise a ribbon cable connecting sequential driver boards 60b,c,d in parallel, but preferably comprises a printed circuit card with short sections of ribbon cable 68 connecting the card to the boards. The transmission line networks 66 in FIG. 5 may be structured in accordance with the improved transmission line network 50 depicted in FIG. 4 and described hereafter.

Referring again to FIG. 4, design of the improved transmission line network 50 begins with selection of certain network parameters, including the desired rise (or fall) time $t_r$ and noise (overshoot and cross-talk) limits. Suitable parameters for purposes of this description are a rise time of 10 ns and a noise limitation for cross talk and for overshoot of 10%. Based on these parameters, one can then determine whether the invention should be applied to any particular transmission line network.

The noise limitation of 10% means, among other things, that the coupling capacitance should not exceed 10% of the total capacitance. More generally, this relationship can be expressed as follows:

$$C_{tot} \geq C_c \left( \frac{V_{oh}}{V_{xt}} \right) \quad (1)$$

where $C_{tot}$ is the total network capacitance, including all load capacitance, trace capacitance, coupling capacitance, termination capacitance, and all capacitance added during the design process, as described below, $C_c$ is the coupling capacitance, $V_{oh}$ is the high-level output voltage (for example, 5 volts for TTL-compatible devices), and $V_{xt}$ is the maximum amplitude of cross talk noise.

Thus, one should start the design process by calculating the total capacitance for the transmission line network 16 (FIG. 2). Except as to coupling capacitance, which is discussed below, an approximation for total capacitance may be derived from data available in handbooks commonly available to those having skill in the pertinent art. If the coupling capacitance exceeds 10% (or such other limitation as is selected) of the total capacitance, additional capacitance should be added between the transmission line network 16 and ground to make the total capacitance greater than 10 times the coupling capacitance. Preferably, any necessary additional capacitance should be added as close as possible to the point at which capacitive coupling is greatest. One method for identifying the points of capacitive coupling is set forth below.

In general, the present invention is not necessary if the following approximate inequality is satisfied:

$$2(L_{net}C_{tot})^{\frac{1}{2}} \leq t_r \quad (2)$$

where $L_{net}$ is the net series inductance of the transmission line network from the driver to the farthest load, $C_{tot}$ is the total capacitance for the transmission line network, including any added capacitance, and the constant 2 reflects a noise limitation for overshoot of approximately 7%. The net series inductance includes the inductance of all connectors and of all traces on a printed circuit board (or wire in a ribbon cable), including inductive coupling from nearby traces, and may be calculated from data available in handbooks commonly available to those having skill in the pertinent art. The total capacitance may be calculated in a similar manner.

Accurate approximations for inductive and capacitive coupling are needed to calculate the net series inductance and the total capacitance, as well as to model the performance of the transmission line network 50 as described below. In this regard, the following papers set forth derivations for useful, shorthand approximations for inductive and capacitive coupling: J. R. Birchak & H. K. Haill, "Coupling Coefficients for Signal Lines Separated by Ground Lines on PC Boards," *Proceedings of* 1989 *International Test Conference,* Paper 8.1, pp. 190–98; J. R. Birchak & H. K. Haill, "Characteristic Impedance and Coupling Coefficients for Multilayer PC Boards," *Proceedings of* 1988 *International Test Conference,* Paper 2.3, pp. 28–38; and H. K. Haill & J. R. Birchak, "Multilayer PC Board Design Approximations for High Speed Functional Testing," *Proceedings of* 1987 *International Test Conference,* Paper 15.1, pages 354–62.

The expression in Equation 2 can be derived from the more general expression:

$$\frac{V_{os}}{V_{oh}} = \exp\left( -\pi \div \left( \frac{4L_{net}}{R_{tot}^2 C_{tot}} - 1 \right)^{\frac{1}{2}} \right) \quad (3)$$

and the approximation:

$$t_r \approx 1.75 R_{tot} C_{tot} \quad (4)$$

where $V_{oh}$ is the high level output voltage, $V_{os}$ is the maximum amplitude of the overshoot noise in excess of $V_{oh}$, and $R_{tot}$ is the effective resistance of the network at the driver, including the driver resistance and all series resistances and parallel networks of resistances as viewed from the driver. Equation (4) is an approximation accurate only to within approximately 30%, but is adequate for purposes of the design process described herein. By solving Equation (4) for $R_{tot}$ and substituting the same into Equation (3), one can derive an expression for Equation (2) for any particular overshoot noise limit from 0% to approximately 30%.

Where the inequality set forth in Equation (2) is satisfied, indicating that the invention is not needed to achieve the chosen rise time, the rise time that may be expected from the particular transmission line network may be determined as follows:

$$t_r = 2.2(R_x + R_g)C_{tot} \quad (5),$$

where $R_x$ is the effective resistance, as seen at the driver, contributed by the load (socket or row isolation) resistors $R_{Li}$, $R_g$ is the internal resistance of the driver, and the constant 2.2 is a factor based on the definition of rise time $t_r$ as being the time required for the signal to rise from 10% to 90% of $V_{oh}$. The load resistors $R_{Li}$ may be adjusted to give the desired rise time $t_r$ in Equation (5).

If the inequality in Equation (2) is not satisfied, the invention can be applied to the particular transmission line network. The first step in designing an improved transmission line network 50 in accordance with the principles of the invention is to select an initial value for the load resistors $R_{Li}$, as follows:

$$R_{Li} = \frac{t_r}{2C_{Li}}, \quad (6)$$

where $t_r$ is the desired rise (or fall) time and $C_{Li}$ is the effective capacitance of the load or DUT, which should be the same with respect, to all DUTs.

Referring to FIG. 2, the next step in designing the improved transmission line network is to obtain the voltage waveform of a step function transmitted along the transmission line network 16, as measured at the first and last capacitive loads $C_{L1}, C_{Li}$, using as load resistors the value calculated in Equation (6). This may be accomplished by constructing an actual test circuit in the laboratory and observing the waveforms with an oscilloscope or by modelling the circuit on a computer using a suitable circuit modelling program such as the PSPICE program by MicroSim Corporation, Irvine, California 92718. A computer model is generally preferred because the model can be adapted relatively easily for subsequent iterative changes in the configuration of the transmission line network, as described below.

Generally, computer models of electric circuits are constructed by defining the type of each discrete device in the circuit, the location of the device by node numbers, and the device characteristics. Once a circuit has been modelled, one can obtain, among other things, a printout of the voltage waveform at any node. By adding a model of the parallel transmission line network 30 (FIG. 2) to the model of the first transmission line network 16, with the two lines coupled by inductive and capacitive coupling, one can measure cross-talk distortion, as well. This may be accomplished by leaving the second transmission line network 30 passive (without an active signal) and observing the voltage waveform induced in the second transmission line network 30 by the signal in the first network 16. This process enables one to identify and locate the presence of cross-talk distortion.

The preferred method for designing the improved transmission line network 50 (FIG. 4) proceeds by changing the configuration of the transmission line network 16 (FIG. 2) at the first capacitive load $C_{L1}$ to obtain the desired waveform. If the waveform at the first capacitive load $C_{L1}$ is distorted by the step distortion (see signal A in FIG. 3) caused by signal reflection along the transmission line network 16, then one should add extra capacitance $C_x$ (FIG. 4) between the network 16 and ground near the first capacitive load $C_{L1}$. The extra capacitance $C_x$ should be large enough to smooth the step distortion in the waveform at the first load $C_{L1}$, as indicated by circuit modelling. The smoothing action results from a boosting of the initial step of the rising (or falling) edge with added overshoot, in combination with some damping.

If the addition of extra capacitance $C_x$ slows the rise time of the waveform at the first load $C_{L1}$ beyond the parameter originally specified, then one should reduce the extra capacitance $C_x$ and add a resistor $R_{D1}$ (FIG. 4) in series with the transmission line network after the first load $C_{L1}$. Of course, if the first load $C_{L1}$ in the model circuit is actually several DUTs or capacitive loads, as explained above, then the series resistor $R_{D1}$ would be positioned after the last load of the several comprising the first model load $C_{L1}$.

In general, the series resistor $R_{D1}$ is substantially smaller than the load resistor $R_{L1}$. The effect of the series resistor $R_{D1}$ is to dissipate reflections from the transmission line network 16, thereby reducing distortion due to reflection without affecting the rise time at the first load $C_{L1}$. The rise time at the first load $C_{L1}$ also can be improved by adjustments to the load resistor $R_{L1}$. Decreasing the load resistor $R_{L1}$ speeds up the rise time at the first load $C_{L1}$ and, to a much lesser extent, slows the rise time at loads $C_{Li}$ downstream on the transmission line network 16. In order to obtain the desired waveform at the first load $C_{L1}$, one should iteratively model the network 16 (FIG. 2), as explained above, with different values for $C_x$, $R_{D1}$, and $R_{L1}$ (shown in FIG. 4), until the waveform converges on the desired configuration.

After the waveform at the first load or group of consecutive loads $C_{L1}$ is satisfactory, one should examine the waveform at the second and subsequent loads $C_{Li}$ to identify the point at which the waveform begins to deteriorate from the desired configuration. It is likely that waveform will remain satisfactory at one or more subsequent loads or groups of loads $C_{Li}$ after the first load $C_{Li}$. When one has identified a load at which the waveform is not satisfactory, one should add a series resistor $R_{D2}$ after the particular load in question ($C_{L3}$ as shown in the example in FIG. 4) and adjust the values of the series resistor $R_{D2}$ and the corresponding load resistor ($R_{L3}$ in FIG. 4) iteratively by means of the computer model until the waveform at the load $C_{L3}$ converges on the desired configuration. It is not necessary to add extra capacitance $C_x$ in addition to that already added at the first load $C_{L1}$.

The addition of series resistors $R_{Di}$ after the first series resistor $R_{D1}$ and changes to the load resistors downstream of the first load $C_{L1}$ will not adversely affect the rise time at the first load $C_{L1}$, but may contribute to overshoot. Any such potential problems at loads upstream of the load under consideration at any given time should be ignored until a later stage of the design process, as explained below.

This procedure should be repeated at successive loads or groups of loads $C_{Li}$ downstream on the transmission line network 16 until one has reached the far end of the network 16. After one has inserted series resistors $R_{Di}$ and adjusted the load resistors $R_{Li}$ all down the network, one should repeat the procedure starting at the first load $C_{L1}$ to compensate for changes in the waveform due to adjustments at downstream loads $C_{Li}$.

When the waveform at all loads $C_{Li}$ has the same rise (or fall) time and the same amount of overshoot, then one can increase or decrease all load resistors $R_{Li}$ and all series resistors $R_{Di}$ proportionately to attempt to diminish the overshoot or speed up the rise time simultaneously at all loads $C_{Li}$. In addition, one should attempt to reduce or eliminate the extra capacitance $C_x$ at the first load $C_{L1}$ (FIG. 4) by placing as much of the capacitance $C_x$ in a termination capacitor $C_T$ at the far end of the transmission line network so as to reduce the amount of power that the driver must dissipate.

Thus, as depicted in FIG. 4, the improved transmission line network 50 for delivering digital electronic signals to a plurality of capacitive loads $C_{Li}$ preferably includes added capacitance for the purpose of reducing distortion due to capacitive coupling and for boosting the rising (or falling) edge of the signal, series resistors positioned on the transmission line network so as to dissipate reflected signals and to reduce distortion caused thereby, and load resistors with values that vary from load to load to optimize the rise (or fall) time of signals propagated along the transmission line network.

Figure 6:
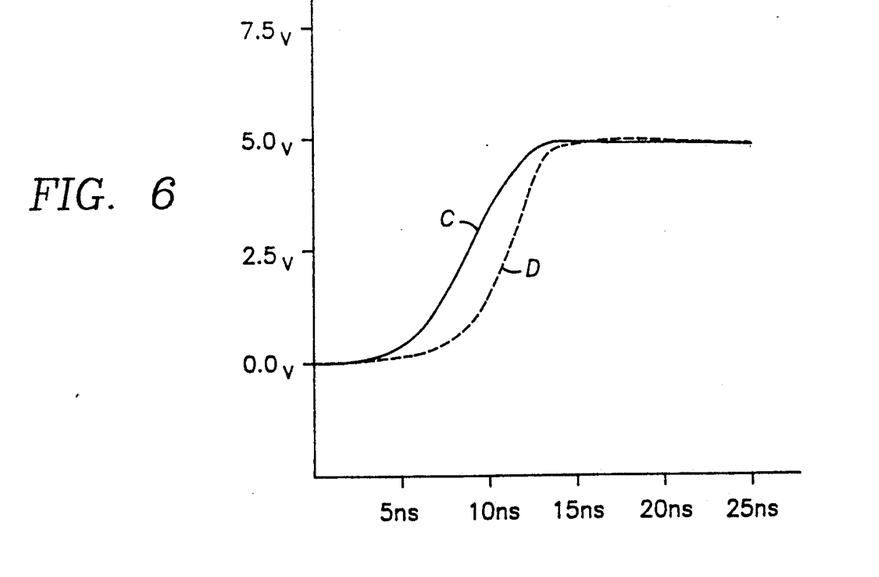
FIG. 6 is a graph depicting voltage waveforms at two points on the transmission line network shown in FIG. 4.

FIG. 6 depicts the voltage waveform C at the first capacitive load $C_{L1}$ and the voltage waveform D at the last capacitive load $C_{Li}$ on the improved transmission line network 50 designed as set forth herein. Both voltage waveforms C,D demonstrate a common, fast rise time and no excessive overshoot.

Preferably, the improved transmission line network may also include a near end impedance matching network $R_{Fi} C_{Fi}$. A connector in a transmission line network represents an impedance discontinuity in the form of a large, inductance ($L_B$ in FIG. 4). The impedance of a connector may be on the order of 200Ω, while the characteristic impedance of the transmission line network 50 may be on the order of 30Ω. Thus, in order to achieve uniform transmission line characteristic impedance through the connector, it is desirable to reduce the effective impedance of the connector inductance $L_B$ by adding a capacitor $C_F$ to ground at each impedance discontinuity.

In addition, to avoid reflections as a consequence of capacitance $C_F$, it is desirable to add a resistor $R_F$ in series with the capacitance $C_F$ to dissipate reflections. Preferably, the impedance matching resistors $R_F$ are small as compared to the characteristic impedance of the transmission line network 50. Where space permits, a first impedance matching network $R_{F1}, C_{F1}$ should be added to the near side of the connector and a second network $R_{F2}, C_{F2}$ should be added to the far side of the connector. If space does not permit a network on both sides of the connector, a network $R_F, C_F$ on one side only usually will suffice.

In addition, the improved transmission line network 50 preferably includes a termination network $R_T C_T$, the principal purpose for which is to reduce cross-talk without substantially increasing the power dissipated by the driver and without substantially increasing the rise time of signals propagated along the network. For these reasons, the impedance of the termination network preferably is substantially greater than the characteristic impedance of the transmission line network 50.

For purposes of designing the termination network, one can select a termination resistor with a resistance equal approximately to the impedance of the transmission line network and a capacitor having a relatively small capacitance, thereby yielding a termination impedance substantially greater than the characteristic impedance of the transmission line network. The termination resistor $R_T$ and capacitor $C_T$ may then be adjusted iteratively as explained earlier. Increasing $C_T$ tends to diminish cross-talk, but slows the signal rise time. Decreasing $R_T$ tends to diminish cross-talk, but increases signal reflections. Increasing $R_T$ tends to decrease rise time. The values of $R_T$ and $C_T$ should be adjusted iteratively to achieve an optimum rise time within the specified noise limitation and driver power specifications.

Thus, the improved transmission line network may be achieved by a combination of three variations from the traditional transmission line network not terminated with its characteristic impedance: (1) additional capacitance; (2) series resistors; and (3) load or isolation resistors of various magnitudes. It should be noted that, in some instances, it may not be necessary to use each of the three elements to achieve a transmission line substantially free of distortion within the specified noise limitation and having a substantially uniform, specified rise time.

For example, depending on the particular circuit involved, one may be able to achieve the desired characteristics using only series resistors, with no added capacitance, and with no load resistors or with load resistors having a common magnitude. Similarly, depending on the particular application, one may find it unnecessary to repeat the iterative adjustments until each waveform conforms precisely to the specified parameters, so long as the results achieved are satisfactory for the application. It is preferred that the design process be accomplished with as few iterations as possible. Thus, while a preferred embodiment of the invention has been shown and described, modifications can be made by one skilled in the art without departing from the principles of the present invention.

What is claimed is:

1. A transmission line network for communicating signals from a signal source to a plurality of capacitive loads, comprising:
   a transmission line electrically connecting the signal source to the plurality of capacitive loads, said transmission line having a near end at the signal source and a far end away from the signal source and being terminated at its far end with an impedance not substantially equivalent to its characteristic impedance; and
   a plurality of discrete resistors connected in series with said transmission line for shaping the rising or falling edge of signals propagated along said transmission line.

2. A transmission line network for communicating signals from a signal source to a plurality of capacitive loads, comprising:
   a transmission line electrically connecting the signal source to the plurality of capacitive loads, said transmission line having a near end at the signal source and a far end away from the signal source and being terminated at its far end with an impedance not substantially equivalent to its characteristic impedance;
   a plurality of resistors connected in series with said transmission line for shaping the rising or falling edge of signals propagated along said transmission line; and
   a plurality of resistors for connecting said capacitive loads to said transmission line, each resistor of said plurality being of a magnitude selected to obtain in cooperation with said plurality of series resistors a substantially common rise time at each load.

3. A transmission line network according to claim 2, further comprising:
   a capacitor connecting said transmission line to ground for smoothing the rising or falling edge of signals propagated along said transmission line.

4. A transmission line network according to claim 3, wherein each resistor of said plurality of series resistors shapes the waveform of signals propagated along said transmission line by dissipating reflected signals.

5. A transmission line network according to claim 4, wherein each resistor of said plurality of series resistors shapes the waveform of signals propagated along said transmission line by reducing propagated signal current.

6. A transmission line network in a burn-in system for communicating signals from a driver to a plurality of DUTs on a burn-in board, comprising:
   a transmission line electrically connecting the driver to the plurality of DUTs, said transmission line having a near end at the driver and a far end away from the driver and being terminated at its far end with an impedance not substantially equivalent to its characteristic impedance; and
   a plurality of resistors connected in series with said transmission line for shaping the rising or falling edge of signals propagated along said transmission line.

7. A transmission line network according to claim 6, further comprising
   a plurality of resistors for connecting said DUTs to said transmission line, each resistor of said plurality being of a magnitude selected to obtain in cooperation with said plurality of series resistors a substantially common rise time at each DUT.

8. A transmission line network according to claim 7, further comprising:
a capacitor connecting said transmission line to ground for smoothing the rising or falling edge of signals propagated along said transmission line.

9. A transmission line network according to claim 8, wherein each resistor of said plurality of series resistors shapes the waveform of signals propagated along said transmission line by dissipating reflected signals.

10. A transmission line network according to claim 8, wherein each resistor of said plurality of series resistors shapes the waveform of signals propagated along said transmission line by reducing propagated signal current.

11. A method for designing a transmission line network for communicating signals from a signal source to a plurality of capacitive loads, the signals being substantially free of distortion exceeding a specified noise limitation and having a substantially uniform, specified rise time, comprising the steps of:
(a) creating a model of a transmission line network, including a transmission line connecting a signal source to a plurality of capacitive loads, the transmission line being terminated with an impedance not substantially equivalent to its characteristic impedance;
(b) at selected loads along the transmission line, observing waveforms resulting from a signal introduced onto the transmission line by the signal source; and
(c) adding shunt capacitance and series resistance to the transmission line, as needed, and iteratively adjusting the magnitude of such capacitance and series resistance, as needed, to conform the waveforms to the specified rise time and noise limitation.

12. A method for designing a transmission line network for communicating signals from a signal source to a plurality of capacitive loads, the signals being substantially free of distortion exceeding a specified noise limitation and having a substantially uniform, specified rise time, comprising the steps of:
(a) creating a model of a transmission line network, including a transmission line connecting a signal source to a plurality of capacitive loads, the transmission line being terminated with an impedance not substantially equivalent to its characteristic impedance;
(b) obtaining at a first capacitive load or group of loads a waveform resulting from a signal introduced on the transmission line by the signal source;
(c) if the waveform at the first capacitive load or group of loads does not conform substantially to the specified rise time and noise limitation, modifying the configuration of the transmission line network by adding capacitance and series resistance and iteratively adjusting the magnitudes of the added capacitance and series resistance to conform the waveform substantially to the specified rise time and noise limitation;
(d) selecting a capacitive load or group of loads downstream on the transmission line from the load or group of loads for which the waveform was last obtained;
(e) obtaining at the selected load or group of loads a waveform resulting from a signal introduced on the transmission line by the signal source;
(f) if the waveform at the selected load or group of loads does not conform substantially to the specified rise time and noise limitation, modifying the configuration of the transmission line network by adding series resistance and iteratively adjusting the magnitude of the series resistance to conform the waveform substantially to the specified rise time and noise limitation;
(g) repeating said steps (d), (e), and (f) through to the far end of the transmission line;
(h) beginning again at the near end of the transmission line and proceeding down to the far end of the transmission line, obtaining at successive loads or groups of loads the waveform resulting from a signal introduced on the transmission line by the signal source and adjusting the magnitude of the series resistance as necessary to conform the waveform substantially to the specified rise time and noise limitation; and
(i) repeating said step (h) until the waveform at all such loads or groups of loads conforms substantially to the specified rise time and noise limitation.

13. A method for designing a transmission line network for communicating signals from a signal source to a plurality of capacitive loads, the signals being substantially free of distortion exceeding a specified noise limitation and having a substantially uniform, specified rise time, comprising the steps of:
(a) creating a model of a transmission line network, including a transmission line connecting a signal source to a plurality of capacitive loads, with each load being connected to the transmission line through a load resistor and the transmission line being terminated with an impedance not substantially equivalent to its characteristic impedance;
(b) obtaining at a first capacitive load or group of loads a waveform resulting from a signal introduced on the transmission line by the signal source;
(c) if the waveform at the first capacitive load or group of loads does not conform substantially to the specified rise time and noise limitation, modifying the configuration of the transmission line network by adding capacitance and series resistance and iteratively adjusting the magnitudes of the added capacitance, series resistance, and load resistance as necessary to conform the waveform substantially to the specified rise time and noise limitation;
(d) selecting a capacitive load or group of loads downstream on the transmission line from the load or group of loads for which the waveform was last obtained;
(e) obtaining at the selected load or group of loads a waveform resulting from a signal introduced on the transmission line by the signal source;
(f) if the waveform at the selected load or group of loads does not conform substantially to the specified rise time and noise limitation, modifying the configuration of the transmission line network by adding series resistance and iteratively adjusting the magnitude of the series resistance and load resistance as necessary to conform the waveform substantially to the predetermined rise time and noise limitation;
(g) repeating said steps (d), (e), and (f) through to the far end of the transmission line;
(h) beginning again at the near end of the transmission line and proceeding down to the far end of the transmission line, obtaining at successive loads or groups of loads the waveform resulting from a signal introduced on the transmission line by the signal source and adjusting the magnitude of the series resistance and load resistance as necessary to conform the waveform substantially to the predetermined rise time and noise limitation; and (i) repeating said step (h) until the waveform at all such loads or groups of loads conforms substantially to the predetermined rise time and noise limitation.

* * * * *